United States Patent [19]

Imran

[11] Patent Number: 4,592,367
[45] Date of Patent: Jun. 3, 1986

[54] APPARATUS AND METHOD FOR DIGITAL RATE AVERAGING

[75] Inventor: Mir Imran, Pittsburgh, Pa.

[73] Assignee: Mieczyslaw Mirowski, Owings Mills, Md.

[21] Appl. No.: 581,904

[22] Filed: Feb. 21, 1984

[51] Int. Cl.⁴ ............................................. A61B 5/04
[52] U.S. Cl. .................................. 128/706; 128/703; 128/419 D; 377/54
[58] Field of Search ........... 128/706; 324/78 D, 78 R, 324/79 D; 377/47, 49, 54, 77, 115, 118; 364/701, 703, 734, 764, 811

[56] References Cited

U.S. PATENT DOCUMENTS

| | | | |
|---|---|---|---|
| 3,346,728 | 10/1967 | Broadhead, Jr. | 364/703 |
| 3,541,417 | 11/1970 | Frank, Jr. | 364/703 |
| 3,569,830 | 3/1971 | Gass et al. | 324/78 D |
| 3,729,677 | 4/1973 | Band | 324/78 D |
| 3,824,385 | 7/1974 | Kiencke | 364/703 |
| 3,829,664 | 8/1974 | Kashio | 377/54 |
| 3,936,663 | 2/1976 | Taylor et al. | 377/49 |
| 3,973,108 | 8/1976 | Hogg | 377/54 |
| 4,118,783 | 10/1978 | Collins | 364/734 |
| 4,137,568 | 1/1979 | Dlugos | 377/54 |
| 4,249,070 | 2/1981 | Miller | 377/54 |
| 4,310,801 | 1/1982 | Baker | 364/703 |
| 4,317,182 | 2/1982 | Takase et al. | 364/734 |
| 4,368,433 | 1/1983 | Imazeki et al. | 364/734 |

OTHER PUBLICATIONS

Kohler, "IBM Technical Disclosure Bulletin" vol. 15, No. 6, Nov., 1972, pp. 1807–1808.

Primary Examiner—William E. Kamm
Attorney, Agent, or Firm—Fleit, Jacobson, Cohn & Price

[57] ABSTRACT

A digital circuit requiring minimum power for accurately and reliably measuring the average pulse rate of a periodic signal. The circuit includes a plurality of flip-flop stages adapted to be configured by control gates either as a binary counter or a shift register in response to the pulses of the periodic input signal. Through a series of configuration gates, each pulse momentarily configures the circuit as a shift register and effects a shift operation, e.g. a divide-by-two operation. After each pulse, the circuit resumes a counter configuration and counts the clock pulses of a crystal controlled clock oscillator. After a few input pulses, the contents of the counter immediately after each shift operation indicates the average periodic rate of the periodic signal in much the same manner as a conventional R-C network. However, the digital circuit is not susceptable to drift caused by temperature changes and also moderates the effects of momentary irregularities in the periodic rate of the signal. In application of the digital circuit, a digital comparator of an implanted cardiac cardioverter compares the counter contents with a preset value which, when exceeded, triggers a cardiac analyzing circuit which determines whether the automatic cardioverter is appropriate.

7 Claims, 9 Drawing Figures

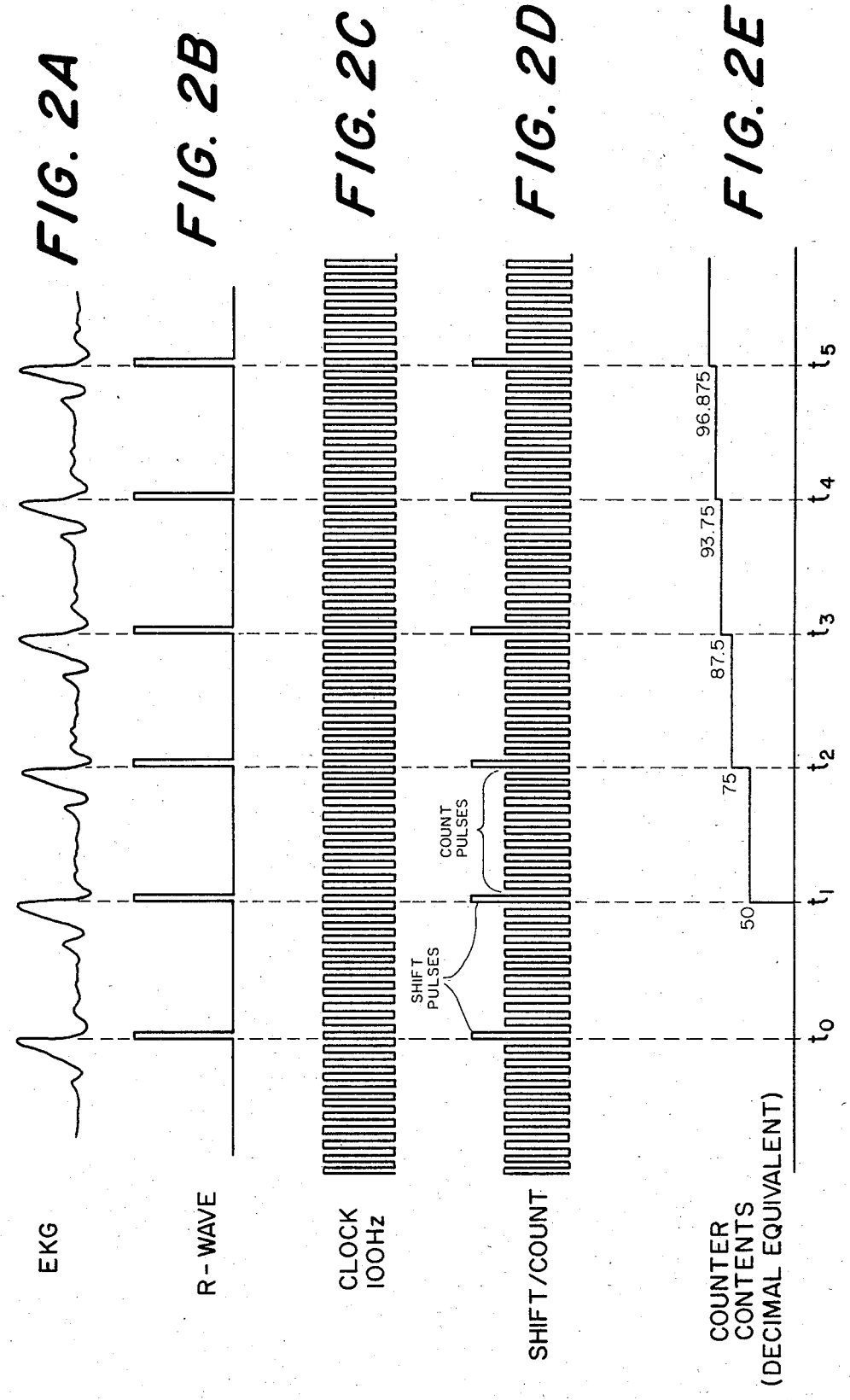

APPARATUS AND METHOD FOR DIGITAL RATE AVERAGING

BACKGROUND OF THE INVENTION

This invention pertains to measuring and detecting devices, but more specifically, to an electronic rate averaging circuit and method therefor which are useful for accurately and reliably determining the average rate of a periodic signal comprising a series of pulses.

Certain critical applications of rate averaging detection demand a very high degree of accuracy and reliability without extensive circuitry, costs and/or power consumption. One such application is in the control of timing operations of functional components of implanted medical devices, such as implantable cardioverters and cardiac pacers which automatically treat arrhythmic heart conditions as they arise in a potentially sick heart of a patient. The components of the implanted medical device are activated on the basis of the rhythm, e.g., timing of electrical events, of the spontaneous beats of the heart. A method or circuit which inaccurately or unreliably measures the spontaneous rhythm might fail to activate the implanted device when it should or, alternatively, activate the implanted device when it should not. In either case, the improper measurement of cardiac events would be undesirable.

Accuracy and reliability can be attained with built-in redundancy or the use of complex circuitry, but this solution usually is costly and impractical for use in implanted medical devices of the type just described where available power and physical space are limited. One previous technique for measuring an average rate employs a resistance-capacitance network which measures the time between the occurrences of electrical events. A drawback of the R-C network is that it is temperature sensitive, e.g., subject to drift in accuracy, and therefore is unreliable. Furthermore, it must be "trimmed" prior to being placed in service, and oftentimes requires trimming thereafter in order to maintain calibration. Obviously, this is undesirable.

Irregularities in periodicity sometimes occur in a periodic signal being measured. This is particularly characteristic of cardiac signals where, to inhibit "false alarms" in an implanted cardioverter, a delay circuit is interposed between the rate sensing circuit and the cardioverter decision circuit to moderate the irregularity. Momentary tachycardia (10-12 beats) is one example of an irregularity which might accidently be interpreted by the automatic cardioverter circuit as a life-threatening arrhythmia, in which case a needless high-energy cardioverting pulse could be delivered to the patient's heart. The delay circuit shields the irregular pulses from the decision circuit, but if the irregularity is sustained, then the irregularity is passed to the decision circuit for appropriate action.

Not only does the environment of an implanted medical device demand high reliability, accuracy, and impose operating limitations on electronic rate averaging circuits, but other applications do so as well. For example, tachometers or inaccessible remote electrical systems may require the same degree of reliability and accuracy, thus the application of the invention described below is not limited to implanted medical devices.

SUMMARY OF THE INVENTION

In view of the foregoing, a primary objective of the present invention is to provide a method and apparatus for accurately and reliably measuring the averaging periodic rate of an electrical event.

It is another objective of the present invention to provide a digital, as opposed to analog, circuit for producing an indication of the average periodic rate of an event.

A further objective of the invention is to provide a digital rate measuring method and apparatus suitable for operating in an implanted medical device for activating the functional components thereof.

A still further objective of the invention is to minimize the power requirements and the size of a circuit for measuring the periodic rate of an electrical event.

A yet further objective of the present invention is to provide a rate averaging method and circuit which moderates irregularities in periodicity of a periodic electrical event in measuring its average rate.

Another objective of the present invention is to provide a digital rate averaging circuit which rapidly approaches the average periodic rate of a electrical event after occurrence of a few pulses thereof.

To attain these and other objectives, the invention comprises a digital circuit capable of functioning as a shift register or a counter in response to the respective states of a control signal. The control signal changes states upon the occurrence of electrical events of a periodic signal being measured. The stages of the digital circuit both serve as the counter and the shift register, depending on how a series of control gates interconnect the stages. Each event pulse of the periodic signal being measured transforms the stages, through the control gates, to a shift register and effects a shifting operation of the contents of the stages. In the preferred embodiment, each event pulse shifts the contents of the stages one stage so as to effectively divide-by-two, although other divide operations, such as a divide-by-four operation (two shifts), also could be accomplished. After each shift operation, the control gates transform the stages back into a counter configuration so that the stages count the number of clock pulses occurring at a rate much higher than the electrical events of the periodic signal. Preferably, a crystal controlled clock oscillator, not being sensitive to temperature drifts and not requiring calibration, generates the clock pulses.

The digital counter registers the number of timing increments of the high rate clock immediately after each shifting operation. The average rate of the periodic signal is determined by the counter contents after occurrence of a few pulses. By this operation, the digital rate averaging circuit determines average rate in much the same manner as a conventional R-C network, but no trimming is required nor is the digital rate averaging circuit subject to temperature drift. Momentary irregularities in the periodicity of the electric events also are moderated and thus the aforementioned delay circuit becomes unnecessary.

Other aspects, features and advantages of the invention will become apparent upon review of the succeeding description taken in connection with the accompanying drawings. The invention though is pointed out with particularly by the appended claims.

BRIEF DESCRIPTION OF THE DRAWINGS

FIGS. 2A, 2B, 2C, 2D and 2E are timing diagrams illustrating the operation of the digital rate averaging circuit of FIG. 1.

DESCRIPTION OF ILLUSTRATIVE EMBODIMENT

Figure 1:
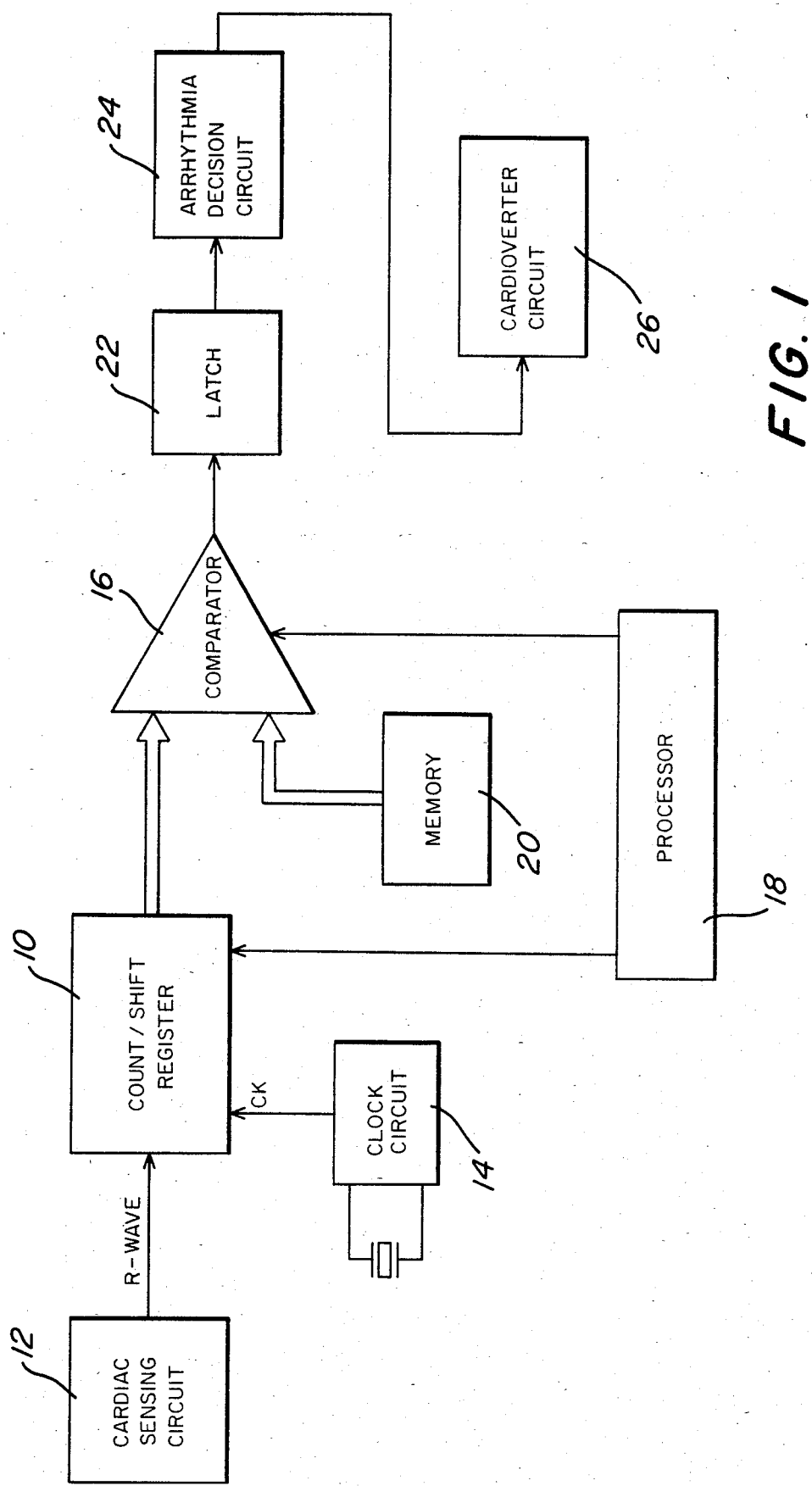
FIG. 1 depicts a block circuit diagram of an implanted cardioverter system in which the inventive rate averaging circuit can be employed.

An exemplary environment in which a rate average circuit 10 of FIG. 1 can be employed in an implanted cardioverter. In the implanted cardioverter, a conventional cardiac sensing circuit 12 senses cardiac signals via electrodes (not shown) connected to the patient's heart. The circuit 12 includes a conventional EKG amplifier for amplifying the cardiac signals indicative of muscular activity of the heart. Cardiac signals are typified in FIG. 2A, which shows a series of EKG waveforms.

The circuit 12 processes the EKG waveforms of FIG. 2A to produce an R-wave signal as shown in FIG. 2B, and supplies the same to the rate averaging circuit 10 implemented by a count/shift register. The R-wave signal is a periodic signal comprising a series of pulses, e.g., electrical events, of which the average rate is measured in order to activate the components of the implanted cardioverter.

A clock circuit 14 generates a series of accurately timed, high rate clock pulses as depicted in FIG. 2C. Although not shown to scale, the clock rate is 100 Hz while the R-wave may occur at 60 beats per minute, e.g., 1 Hz. Immediately after a shift operation (to be explained later), a comparator 16, operated under control of a microprocessor 18, compares the digital data contents in the count/shift register 10 with the digital data contents of a memory 20. Memory 20 is preloaded with a value, for example, representative of a life-threatening event, a "fibrillation rate", and may simply comprise a read-only memory (ROM) or a random access memory (RAM). If the contents of the counter 10 exceed the fibrillation rate immediately after a shift operation, the comparator 16 produces a signal to trip a latch 22 which, in turn, powers up and activates an arrhythmia decision circuit 24. The decision circuit then analyzes the rate of the heart by continuously monitoring the contents of the count/shift register 10 to ascertain the rate and periodicity thereof. If the decision circuit 24 determines that the heart is fibrillating, it energizes a cardioverter circuit 26 in preparation for delivering a high-energy shock to the patient's heart. It also should be noted that the same circuit provides ready access to an accurate, averaged, heart rate at the output of count/shift register 10.

An inventive aspect of the cardioverter system of FIG. 1 is the rate averaging circuit constituted by the count/shift register 10, the clock circuit 14, the comparator 16, and the memory 20. In the preferred embodiment, clock circuit 14 is a crystal controlled oscillator producing the 100 Hz clock pulses. The memory 20 is programmed, or preloaded, so that the comparator 16 triggers the latch 22 when an event, e.g., heart rate, exceeds 100 to 300 beats per minute.

To explain how the count/shift register 10 measures the average rate, reference is made to FIGS. 2D and 2E. Time instances t0, t1, t2, t3, t4 and t5 . . . mark occurrences of events, e.g., R-waves. Assuming the system is cleared for initial operation, the contents of the stages of the count/shift register 10 are "zero". The first event at t0 effectively transforms the circuit 10 into shift state for about one to two milliseconds during which time the contents thereof are shifted one place to the left (assuming the left direction contains the lower significant bits as shown) so as to divide the content by two. After the shift operation, the circuit 10 is transformed back into a counter whereupon the 100 Hz clock pulses are counted. Assuming the events of the heart beat occur exactly at a constant rate of sixty beats per minute (1 Hz), at time t1, the circuit 10 again is momentarily transformed into a shift register circuit after which a shift operation occurs. After the shift at time t1, the counter contains 50-count. At time t2, another shift/divide-by-two operation occurs, whereupon the counter contains 75-count. At time t3, after the shift/divide-by-two operation, the counter contains 87.5-count. At time t3, it contains 93.75-count. At time t5, it contains 96.875-count, and so on. As seen, the count in the counter, after a relatively few events, approaches 100-count, indicative of the average rate of one event per second or sixty events per minute.

If, for example, the periodic events become momentarily irregular, such as would result if the heart missed a beat or if the sensing electrodes missed sensing a heart beat, the counter would indicate 150-count at the first regular periodic beat after the first missed beat (e.g. 100-count pulse 200-count divided by two), 125-count at the second regular periodic beat after the missed beat, 112.5-count at the third, 106.25-count at the fourth, 103.125-count at the fifth, and so on until the average rate of 100-count is again indicated. The circuit 10 achieves the same results if the heart momentarily experienced high beating rates or tachycardia. Thus, it is seen that momentary irregularities are moderated after a few beats.

Figure 3A:
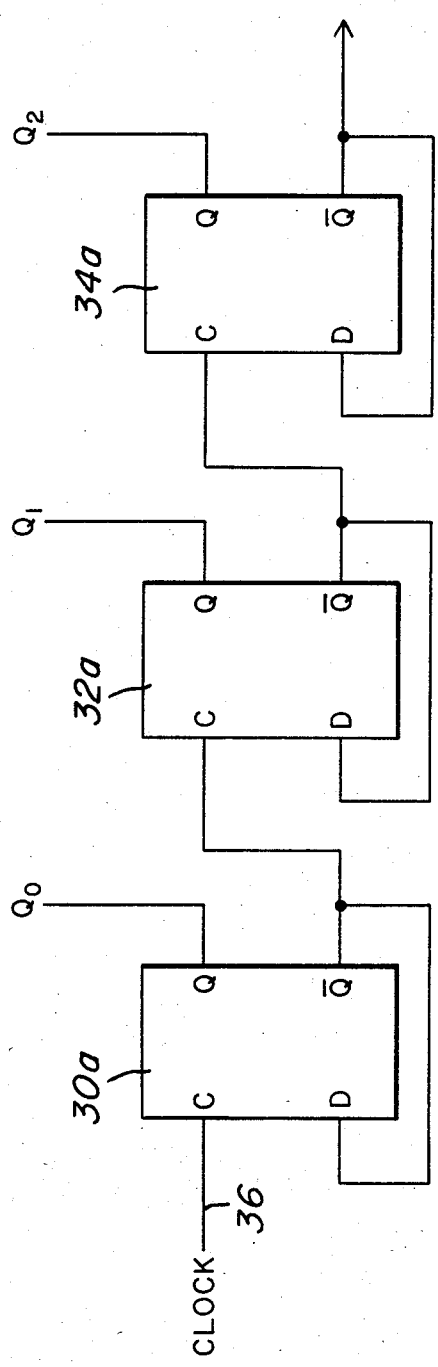
FIGS. 3A and 3B exemplify, respectively, a counter and a shift register useful for explaining the combined operation of the inventive digital rate averaging circuit which combine these circuit components into a single circuit.
Figure 3B:
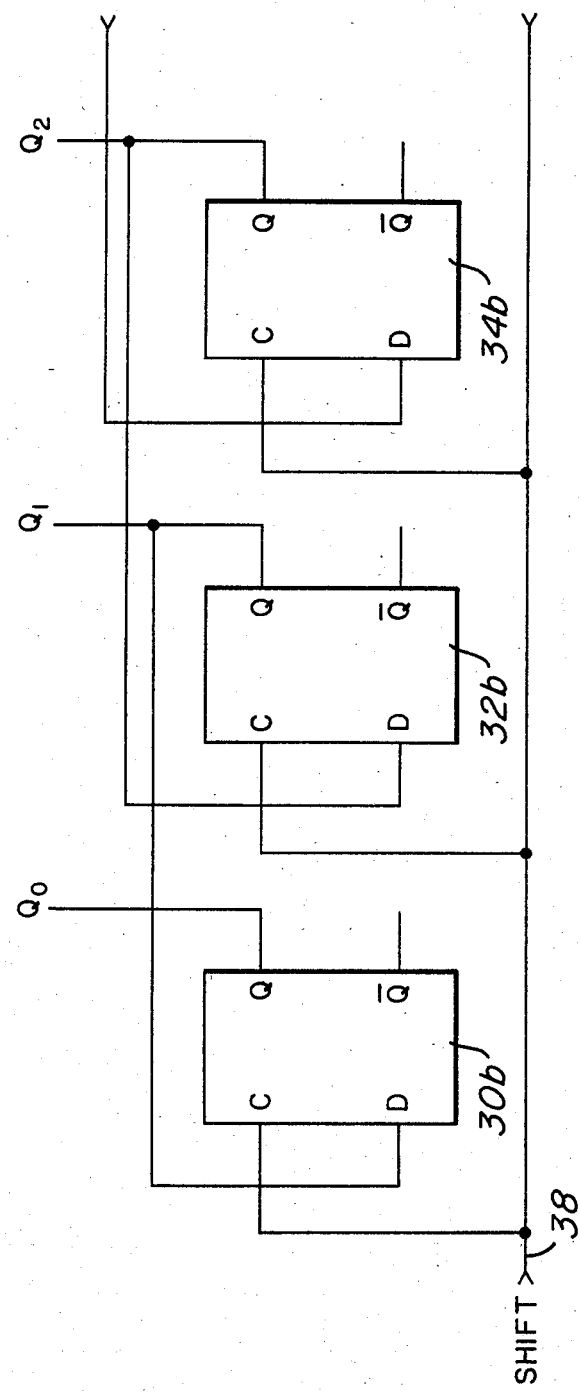
Figure 4:
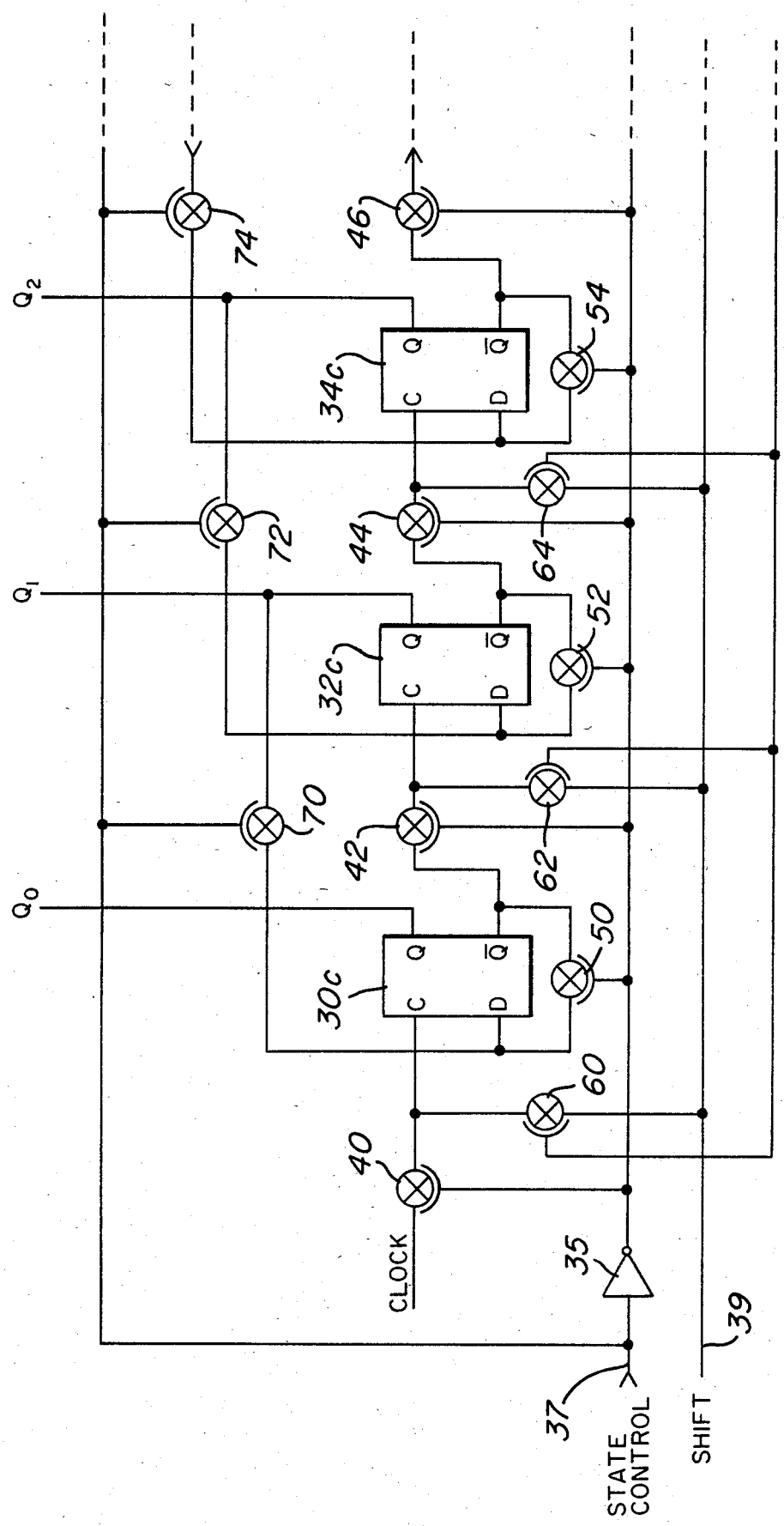
FIG. 4 is a circuit diagram of the stages and control gates of the inventive digital rate averaging circuit of FIG. 1.

FIGS. 3A, 3B and 4 illustrate a preferred circuit implementation of the count/shift register 10 of FIG. 1. Typical binary counter and shift register circuits are depicted in FIGS. 3A and 3B. Each of these circuits consists of series of respective D-type flip-flop stages 30a or 30b, 32a or 32b and 34a or 34b, only three being shown in each circuit for illustrative purpose. In actual construction, the circuits may contain any number of stages. The binary counter of FIG. 3A counts clock pulses at input 36 while the shift register shifts the contents of the flip-flop stages 30b, 32b, and 34b in response to a shift control signal appearing on conductor 38.

In FIG. 4, the functions of both the binary counter and the shift register are combined in three flip-flop stages 30c, 32c and 34c by employing a number of control gates to interconnect the stages either in a counter configuration or a shift register configuration. The control gates respond to a state control signal placed on a conductor 37 and the R-wave pulses constitute the state control signal. In response to a "count" state control signal placed on conductor 37 which is a low-level logic R-wave signal inverted by inverter 35 to high-level logic signal, control gates 40, 42, 44, 46, 50, 52, and 54 interconnect the stages 30c, 32c and 34c so that they function the same as the binary counter of FIG. 3A. While so functioning, gates 60, 62, 64, 70, 72 and 74 are disabled thereby to inhibit a shift register configuration of the flip-flop stages 30c, 32c and 34c.

While being connected in the counter configuration, input 41 receives clock pulses from the crystal controlled clock oscillator 14 of FIG. 1 so that the flip-flop stages 30c, 32c and 34c count the number of clock pulses between the R-wave pulses. As previously indicated, the count after a shift operation indicates the average rate of the R-wave signal.

When the R-wave signal (FIG. 2D) goes high, control gates 60, 62, 64, 70 72 and 74 become enabled to configure the stages as a shift register, and simultaneously, control gates 40, 42, 44, 46, 50, 52 and 54 become disabled to inhibit the counter configuration. Within one or two milliseconds after the occurrence of the R-wave pulse, the processor 18 (FIG. 1) delivers a shift control signal over conductor 39 through enabled control gates 60, 62 and 64 thereby to shift the contents Q0, Q1, Q2 . . . of the flip-flop stages 30c, 32c and 34c one stage to the left. This shifting operation has the effect of dividing the shift register contents by two.

Immediately after the divide-by-two operation, the outputs Q0, Q1, Q2 . . . are supplied to the comparator 16 (FIG. 1) where they are compared with a digital value preprogrammed in the memory 20, as previously explained. When the preprogrammed value is exceeded, the beat rate analyzing operations of the decision circuit 24 take place. Thereafter, the circuit of FIG. 4 alternately performs the operation of transforming the stages to the shift and count configuration, and the process repeats itself.

The foregoing exemplifies a preferred embodiment of the invention for carrying out a stated objective. Other arrangements and modifications can be made by those skilled in the art to attain the same objectives without departing from the scope and spirit of the invention. For example, D-type flip-flops are shown and described, but the invention also may be practiced with J-K or other types of flip-flops by modifying the circuit connections of the control gates described herein so that the flip-flop stages alternatively function as a counter and shift register. Other circuit components, instead of flip-flops, as well may be employed to achieve the alternative functional operations in a single circuit. Furthermore, the invention is not limited to application in implanted medical devices. Many other critical applications require the reliably, accuracy, and low power drain afforded by this invention in rate averaging circuits. Accordingly, it is not the intent to limit this invention to exactly what is shown and described herein, but to include all such modifications and arrangements as may come within the scope of the appended claims.

What is claimed is:

1. A digital rate averaging circuit for determining the average periodic rate of a periodic signal made up of a series of pulses, said circuit comprises:
   a plurality of stages for storing respective digits;
   gate means responsive to a first state control signal for operatively interconnecting said stages to function as a shift register in a shift state, and responsive to a second state control signal for operatively interconnecting said stages to function as a counter in a count state;
   input means periodically coupled to said plurality of stages by said gate means, said input means for receiving an event signal to be counted when said circuit is in the count state;
   shift input means periodically coupled to said plurality of stages by said gate means, said shift input means responsive to a shift control signal for effecting a shift operation when said circuit is in the shift stage; and
   means responsive to the pulses of said periodic signal for alternately producing said first and second state control signals.

2. The circuit as recited in claim 1, wherein each stage comprises a flip-flop and said gate means comprises a plurality of control gates and means responsive to said first state control signal for configuring said control gates to operatively couple said input means to a first stage of said plurality of stages and to operatively couple each succeeding stage to a preceding stage to effect said counting operation, and to operatively decouple said shift input means from said circuit and to operatively decouple the output of a succeeding stage from the input of a preceding stage thereby to inhibit said shift operation, and responsive to said second state control signal for reconfiguring said control gates to decouple said input means from said first stage and to operatively decouple each succeeding stage from a preceding stage to inhibit the counting operation while coupling said shift input means to said plurality of stages and to operatively couple the output of a succeeding stage to the input of a preceding stage thereby to effect a shift operation.

3. A digital rate averaging circuit for determining the average periodic rate of a periodic signal comprising a series of pulses, said averaging circuit comprising:
   input means for receiving said periodic signal;
   clocking means for producing clock pulses of a given rate;
   counter means including a plurality of stages for counting said clock pulses during a count state;
   shift means for shifting the contents of said counter means by at least one stage in response to a shift command signal during a shift state;
   means responsive to each pulse of said periodic signal to produce said shift command signal whereby the contents of said counter means represents the average periodic rate of said pulse signal after a number of occurrences of pulse of the periodic signal;
   means responsive to the periodic signal for producing a state control signal at the occurrence of each pulse of said periodic signal; and
   gate means alternately responsive to said state control signal for alternately interconnecting said stages to function as said shift means in the shift state, and for operatively interconnecting said stages to function as said counter means in the count state.

4. A digital rate averaging circuit as recited in claim 3, further including:
   comparison means connected to said counter means for comparing the contents of said counter with a predetermined digital input signal and for producing an output signal when the contents of the counter is at least equal to said input signal.

5. A digital circuit for functioning as a counter when operated in a count state, and alternatively, as a shift register when operated in a shift state in response to a state control signal, which circuit comprises:
   a plurality of flip-flop stages for storing respective digits, each of said flip-flop stages having a plurality of inputs and a plurality of outputs;

gate means responsive to said state control signal for operatively interconnecting the inputs and outputs of said plurality of flip-flop stages to function as a shift register in the shift state, and for operatively interconnecting the inputs and outputs of said plurality of flip-flop stages to function as a counter in the count state;

input means for receiving an event signal to be counted when said circuit is in the count state; and shift input means responsive to a shift control signal for effecting a shift operations when said circuit is in the shift state.

6. The circuit as recited in claim 5, wherein said gate means comprises a plurality of control gates and means responsive to said state control signal for configuring said control gates to operatively couple said input means to the inputs of a first flip-flop stage of said plurality of flip-flop stages and to operatively couple each succeeding flip-flop stage to a preceding stage to effect said counting operation, and to decouple said shift input means from said circuit and to operatively decouple the output of a succeeding stage from the input of a preceding stage thereby to inhibit said shift operation, and responsive to a subsequent state control signal for reconfiguring said control gates to decouple said input means from said first flip-flop stage and to operatively decouple each succeeding flip-flop stage from a preceding flip-flop stage to inhibit the counting operation while coupling said shift input means to said plurality of flip-flop stages and to operatively couple the output of a succeeding flip-flop stage to the input of a preceding flip-flop stage thereby to effect a shift operation.

7. A method for determining the average periodic rate of a periodic signal comprising a series of event pulses which method comprises the steps of:

counting a number of periodic clock pulses between the occurrences of the event pulses, said clock pulses occurring at a rate higher than the rate of said event pulses;

accumulating the number of clock pulses during successive occurrences of said event pulse of said periodic signal;

dividing by a predetermined constant the accumulated count at each occurrence of an event pulse of the periodic signal in order to produce a continuously updated representation of the average pulse rate of the periodic signal.

* * * * *